United States Patent [19]
Liddle et al.

[11] Patent Number: 5,985,493
[45] Date of Patent: Nov. 16, 1999

[54] MEMBRANE MASK FOR PROJECTION LITHOGRAPHY

[75] Inventors: James Alexander Liddle, Westfield; Anthony Edward Novembre, Martinsville; Gary Robert Weber, Whitehouse Station, all of N.J.

[73] Assignee: Lucent Technologies Inc., Murray Hill, N.J.

[21] Appl. No.: 09/057,420

[22] Filed: Apr. 8, 1998

[51] Int. Cl.[6] ....................................................... G03F 9/00
[52] U.S. Cl. ...................................................................... 430/5
[58] Field of Search ................................. 430/5, 322, 296

[56] References Cited

U.S. PATENT DOCUMENTS

| | | | |
|---|---|---|---|
| 5,759,722 | 1/1996 | Nozue | 430/296 |
| 5,789,119 | 5/1997 | Okino | 430/5 |

*Primary Examiner*—S. Rosasco

[57] ABSTRACT

An improved, scattering-type mask for use in a charged-particle beam lithography process comprises the mask having a membrane portion and a scattering portion, the membrane portion being fabricated with a conductive material or a plurality of materials in which one of them is conductive. The conductive nature of the membrane portion mitigates the accumulation of charge in the mask, thereby enhancing the definition of the charged-particle pattern transferred from the mask onto the wafer under fabrication and reducing the distortion obtained with the system.

14 Claims, 4 Drawing Sheets

MEMBRANE MASK FOR PROJECTION LITHOGRAPHY

FIELD OF THE INVENTION

The present invention relates to fabrication of integrated circuit devices and, more particularly, to an improved membrane mask for use in a charged-particle beam lithography process and a method of fabricating integrated circuit devices with use of the improved membrane mask.

BACKGROUND OF THE INVENTION

The fabrication of integrated circuit devices typically involves a number of photolithography steps. With lithography, a mask is used to imprint positive or negative pattern images onto a layer of photoresist coating the surface of a semiconductor wafer. The patterns thus applied define the various regions of the integrated circuit device, such as contact windows, gate electrode areas, bonding pad areas, implantation regions, and so forth. Once the resist patterns are imprinted on the device, selective processing techniques are applied to form a device structure or layer. Typically, fabrication of an integrated circuit requires a series of separate masks and lithographic transfer steps. In this way, the patterns from each mask are transferred, layer by layer, onto the surface of the wafer. Masks used in fabricating small feature sizes typically have comprised glass plates covered with hard-surface materials such as chromium, iron oxide, or molybdenum silicide.

Various lithographic techniques are known. Traditionally, integrated circuit exposure tools have involved optical systems using ultraviolet light, but as lithographic technology has advanced, other forms of lithography have evolved such as electron beam, x-ray, and ion beam lithographies. Early forms of lithography involved contact or proximity printing, in which the mask and wafer are placed in direct contact or in close alignment with one another. Due to mask damage associated with those techniques, projection printing has emerged as the preferred technology. See, e.g., U.S. Pat. No. 5,602,619, "Scanner for Step and Scan Lithography System," issued Feb. 11, 1997 to Sogard, assigned to Nikon Precision, Inc. (the "Nikon patent"), hereby incorporated by reference.

Conventional direct-write electron-beam lithography offers advantages, for example, good resolution and large depth of focus, but it has traditionally suffered in terms of its relatively low throughput levels. Projection electron-beam lithography systems have typically used full-field illumination of the mask and an absorption-transparency mask structure to take advantage of good resolution and depth of focus while attempting to capitalize on the higher throughputs achievable with projection systems. E-beam absorption-transparency masks use an aperture approach: certain electrons are blocked by the mask from hitting the wafer surface, while others are allowed to pass through apertures in the mask to contact the wafer. In these systems, increasing the beam current sufficiently to achieve commercially-viable throughput levels results in two principle difficulties: (1) stochastic electron-electron interactions produce an uncorrectable image blur at the wafer surface leading to reduced process latitude which ultimately can limit throughput; and (2) the absorbing mask structure is subject to thermal distortion. These effects vary with voltage, that is, the image blur is reduced at higher voltages but thermal distortion increases with increased voltage. For further background regarding electron-beam lithography, see, e.g., U.S. Pat. No. 5,424,173, "Electron Beam Lithography System and Method," issued Jun. 13, 1995 to Wakabayashi et. al, assigned to Hitachi Ltd., and U.S. Pat. No. 5,674,413, "Scattering Reticle for Electron Beam Systems," issued Nov. 12, 1995 to Pfeiffer et al., assigned to International Business Machines Corp., both of which are incorporated herein by reference.

A modern process for high resolution patterning comprises SCattering with Angular Limitation in Projection Electron-beam Lithography (known as "SCALPEL"), disclosed in U.S. Pat. No. 5,260,151, "Device Manufacture Involving Step-and-Scan Delineation," issued Nov. 9, 1993 to Berger et al., and assigned to Lucent Technologies, Inc. (the present assignee) (the "Berger '151 patent"), which is hereby incorporated by reference. The SCALPEL system employs charged-particle beam lithography, thus offering the depth of focus advantages of e-beam lithography, yet it uses membrane-based, scattering-type masks, not absorption-transparency masks, avoiding the thermal distortion encountered in previous attempts. The SCALPEL masks form a pattern while allowing the electron beam to pass through the membrane masks, rather than blocking electrons. Significant advantages are thus provided by SCALPEL as the transparency improves with increased voltage.

The SCALPEL system is simplistically illustrated in FIG. 1. As shown in FIG. 1, the system essentially comprises an electron beam gun 10 for emitting a beam of electrons 12, a membrane-based mask 40 for modulating the beam, one or more projection lenses 20, for demagnifying and focusing the projected beam, an aperture filter 22 for filtering strongly-scattered electrons, and the wafer 30 having a resist system 32 on its surface. Preferably, the resist system comprises a high-resolution, single layer resist. The mask comprises a membrane portion 42 and a scattering portion 44. Applying the SCALPEL concept, the membrane portion 42 is fabricated with a low atomic number material (e.g., silicon nitride), while the scattering portion 44 is fabricated with a high atomic number material (e.g., tungsten). In this way, electrons passing through both portions of the mask (e.g., beam A), scatter more strongly than electrons passing through only the low atomic number membrane portion (e.g., beam B). The aperture filter 22 blocks the strongly-scattered electrons ($E_S$), while allowing the membrane-only trajectory (beam B) to pass with little change. Image formation is thus achieved by capitalizing on the different scattering properties of the materials used to fabricate the mask.

With this system, the components of the mask depart from the traditional chrome-on-glass configuration. In previous embodiments, the membrane mask was comprised of a silicon-nitride membrane 42 coated with a scattering-portion 44 of tungsten and chromium. The SCALPEL mask also has been designed having struts and skirts for enhancing the mechanical integrity and providing image precision, respectively (see Berger '151 patent, col. 5, lines 35–45). For further background regarding the SCALPEL system and related technology, reference is made to the following U.S. patents, all of which are assigned to Lucent Technologies, Inc., the present assignee, and which are incorporated herein by reference: U.S. Pat. No. 5,663,568, "Apparatus for Controlling a Charged Particle Beam and a Lithographic Process in which the Apparatus is Used," issued Sep. 2, 1997 to Waskiewicz; U.S. Pat. No. 5,316,879, "Sub-micron Device Fabrication Using Multiple Aperture Filter," issued May 31, 1994 to Berger and Liddle (an inventor herein); and U.S. Pats. Nos. 5,258,246, 5,130,213 and 5,079,112, issued November 1993, July 1992, and January 1992, respectively, all three of which are titled "Device Manufacture Involving Lithographic Processing," issuing to Berger et al. Background on SCALPEL is also described in L. R. Harriott & J. A. Liddle, "Projection Electron Beam Lithography: SCALPEL," FUTURE FAB INTERNATIONAL (Technology Publishing, Ltd, 1997), at 143–48, also incorporated by reference.

As with other lithography and charged-particle delineation systems in general, the success of the SCALPEL system is related to the types and function of the masks used. The invention provides an improved mask for use in a charged-particle beam lithography process having particular applicability to the SCALPEL system. Further advantages may appear more fully upon considering the description given below.

SUMMARY OF THE INVENTION

Applicants have discovered a configuration for an improved, scattering-type mask for use in a charged-particle beam lithography process, wherein the mask is of the type having a membrane portion with a predetermined thickness and a scattering portion. The improvement comprises the membrane portion of the mask being fabricated with at least one conductive material for reducing the accumulation of charge in the membrane, thereby enhancing the definition of the pattern transferred from the mask onto the device (i.e., the wafer). The membrane portion may be fabricated with a single material or a plurality of materials in which at least one of them is conductive. The relative concentration of the plurality of materials may vary across the thickness of the membrane portion to define a conductivity gradient, and the gradient may be stepped, linear, arcuate, or parabolic in nature. One or more dopants also may be used to either provide or enhance the conductivity of the membrane. In a preferred embodiment, the membrane portion of the mask is comprised of silicon and silicon nitride, with the ratio of silicon to silicon nitride varying across the thickness of the membrane to define the conductivity gradient.

BRIEF DESCRIPTION OF THE DRAWINGS

For a better understanding of the invention, an exemplary embodiment is described below, considered together with the accompanying drawings, in which.

It is to be understood that these drawings are for the purposes of illustrating the concepts of the invention and are not to scale.

DETAILED DESCRIPTION OF THE INVENTION

Figure 2:
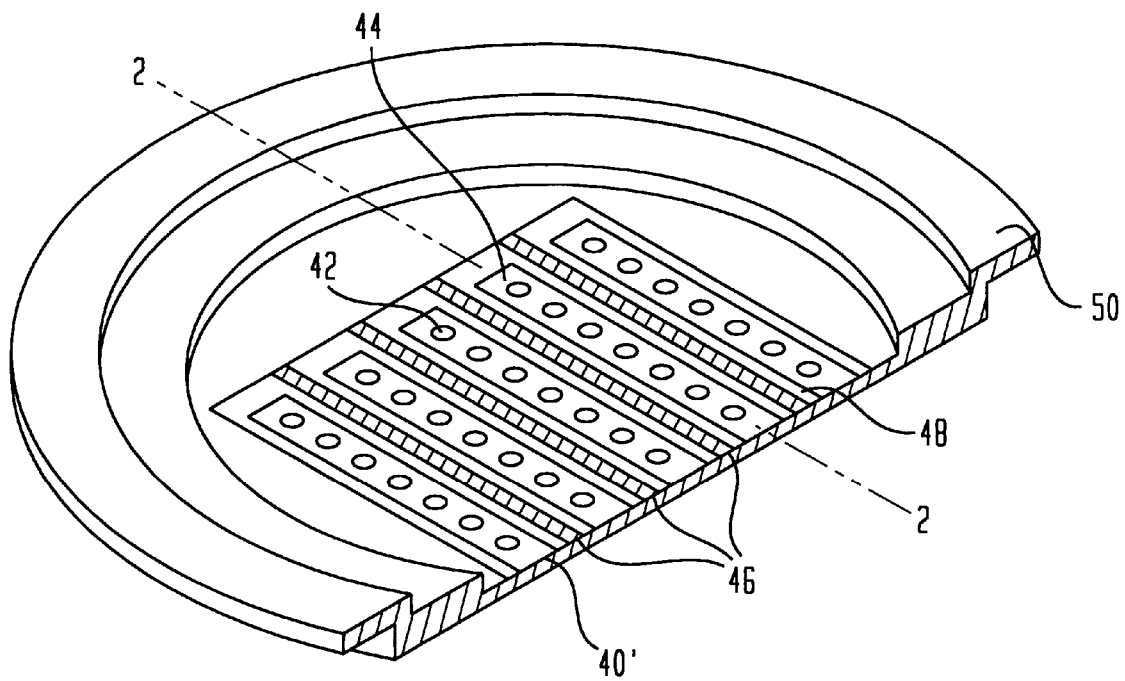
FIG. 2 is a perspective, cut-away of one embodiment of the inventive membrane mask mounted on a support ring for patterning.

Applicants have discovered that a charged-particle beam lithography system using a scattering-type mask may be improved with use of a mask having a membrane portion and a scattering portion, in which the membrane portion is fabricated with at least one conductive material. The membrane portion may be comprised of a single conductive material or a plurality of materials in which at least one of the materials is electrically conductive. Referring to FIG. 2, there is shown a perspective, cut-away of one embodiment of the inventive membrane mask 40,' having a pattern defined therein by membrane 42 and scattering 44 portions of the mask, i.e., the pattern is defined by openings in the scattering portion 44 where only the membrane portion 42 is present. The mask is mounted on a support ring 50 for patterning; and in FIGS. 3A and 3B, there are shown alternative cross-sectional views taken along the line 2—2 of FIG. 2. As seen in FIG. 2, grillage comprising struts 46, and skirts 48 (Berger '151 patent), may be used and chosen to provide mechanical rigidity and strength and to minimize beam heating effects and pattern placement errors. Here, little emphasis is placed on such features not directly bearing on the inventive teaching relating to the membrane portion 42 of the mask.

Figure 3A:
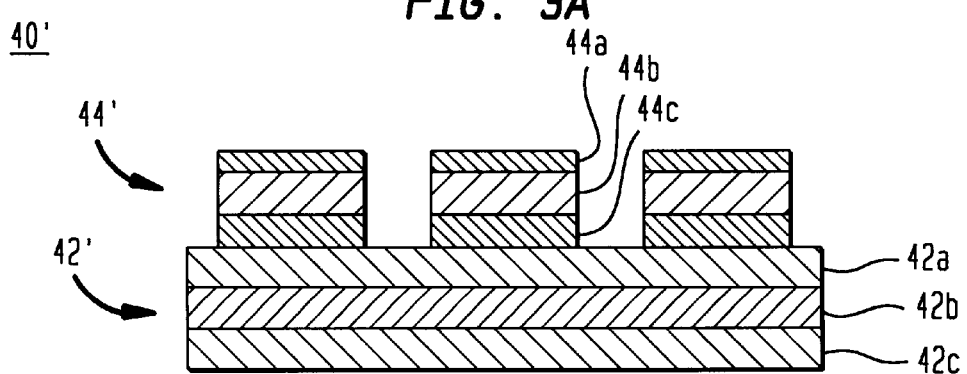
FIG. 3A is a cross-sectional view of one embodiment of the inventive mask taken along the line 2—2 of FIG. 2.
Figure 3B:
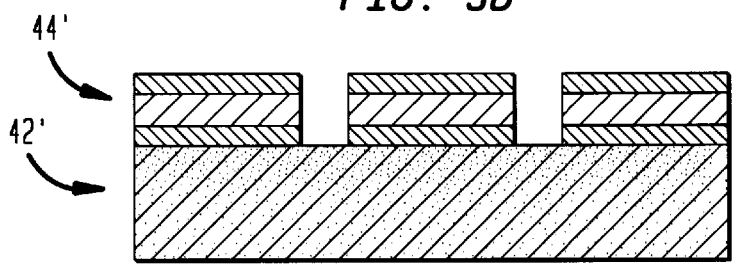
FIG. 3B is a cross-sectional view of an alternative embodiment of the inventive mask taken along the line 2—2 of FIG. 2.

As illustrated in FIGS. 3A–3B, the inventive membrane mask 40' comprises a membrane portion 42,' 42" and a scattering portion 44,' 44." The membrane portion may be fabricated with a single conductive material, such as pure silicon, or it may be fabricated with a plurality of materials. The materials may include binary or tertiary compositions including silicon, nitrogen, carbon, boron or oxygen, such as silicon nitride and silicon carbide, or the materials may embrace elements themselves. The concentration of the plurality of materials may vary across the thickness of the membrane portion to define a conductivity gradient. The conductivity gradient may be stepped, linear, arcuate or parabolic in nature, or it may take other shapes apparent to one skilled in the field.

Figure 1:
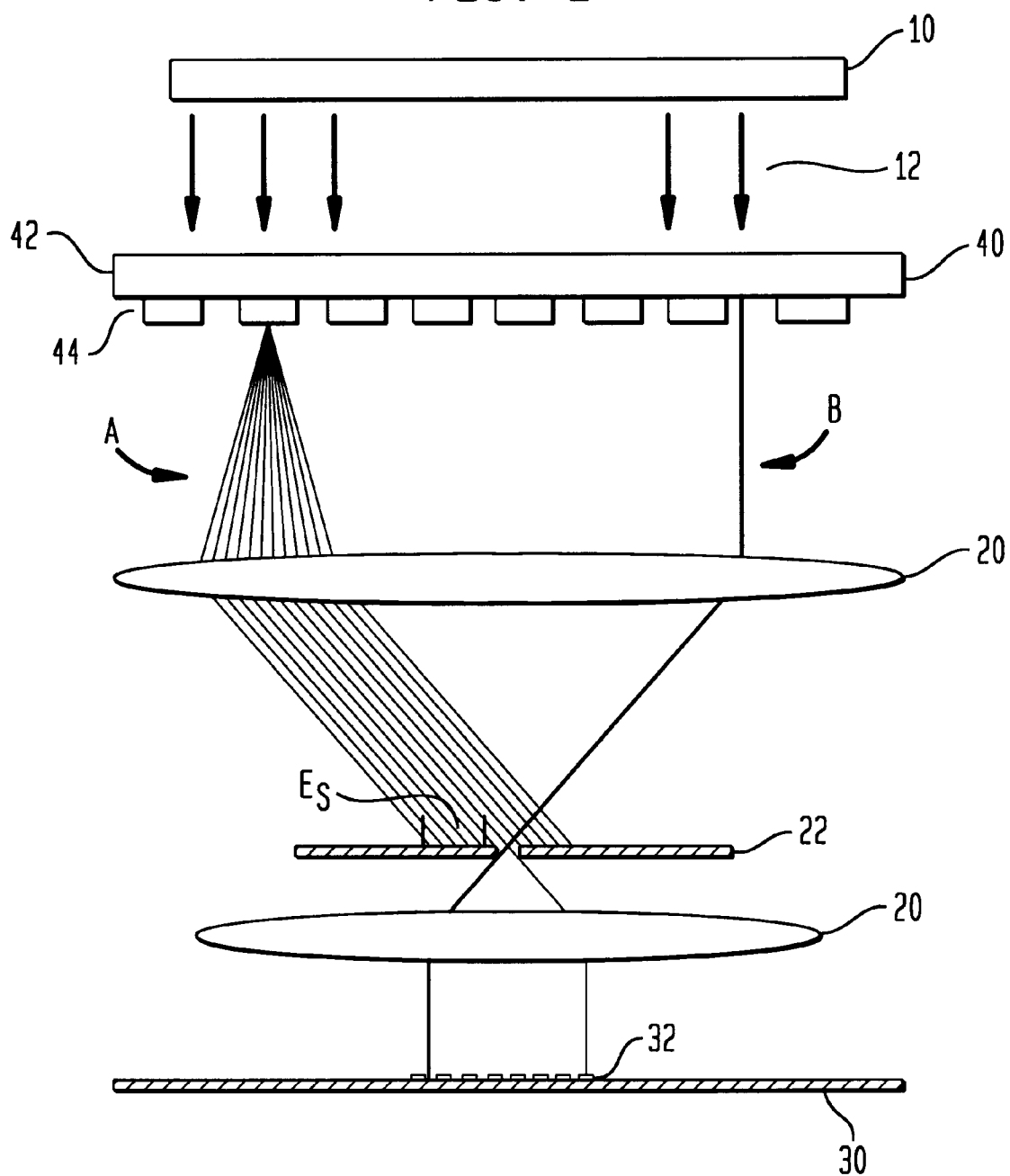
FIG. 1 illustrates a schematic, cross-sectional side view of a projection lithography system applying charged-particle delineation with which the inventive membrane mask may be used.

Also, the materials used to fabricate the mask may include dopants such as boron, arsenic, or phosphorus to either provide or increase the conductivity of the membrane; that is, the membrane portion may be comprised of a non-conductive material diffused or implanted with a conductive dopant, or a dopant may be diffused into a membrane portion fabricated with one or more conductive materials. The dopants may be included throughout the thickness of the membrane. Advantageously, the dopants may be disposed at the surface of the membrane proximal the lens 20, distal the scattering portion 42 of the mask (FIG. 1).

For example, FIG. 3A shows one embodiment where the membrane portion has a stepped conductivity gradient defined by alternating layers of silicon 42a, 42c, and silicon nitride 42b. The scattering portion 44' advantageously comprises alternating layers of chromium 44a, 44c, and tungsten 44b, as described in U.S. Pat. No. 5,500,312, issued to Harriot et al., assigned to Lucent Technologies, Inc., the present assignee, and incorporated herein by reference. FIG. 3B illustrates another embodiment in which the membrane portion 42" has a linearly sloped conductivity gradient involving different concentrations of silicon to silicon nitride across the membrane thickness.

Figure 4A:
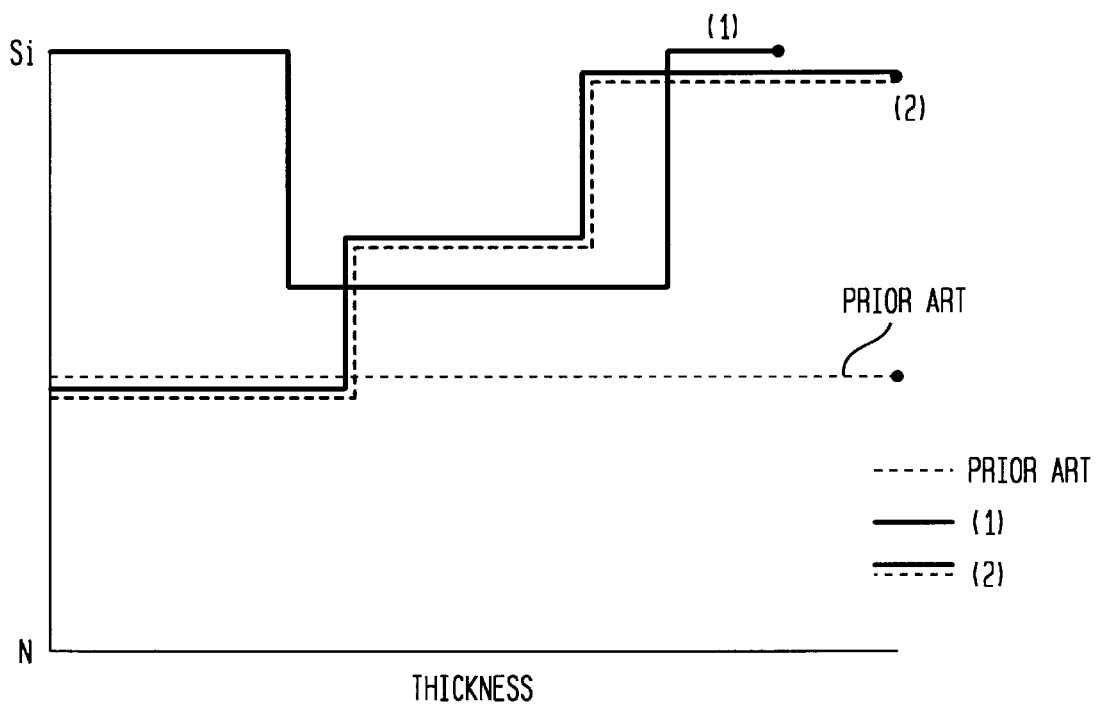
FIGS. 4A, 4B, and 4C are graphs plotting the composition of the materials comprising the membrane portion of the inventive mask as a function of mask thickness.
Figure 4B:
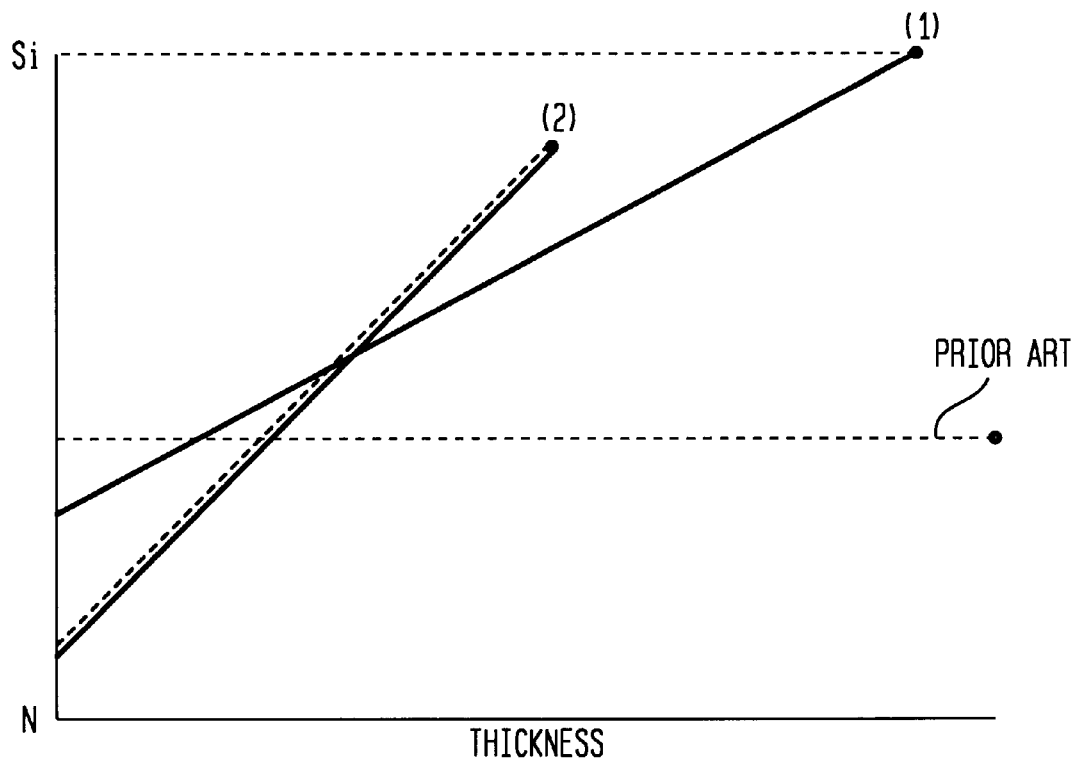
Figure 4C:
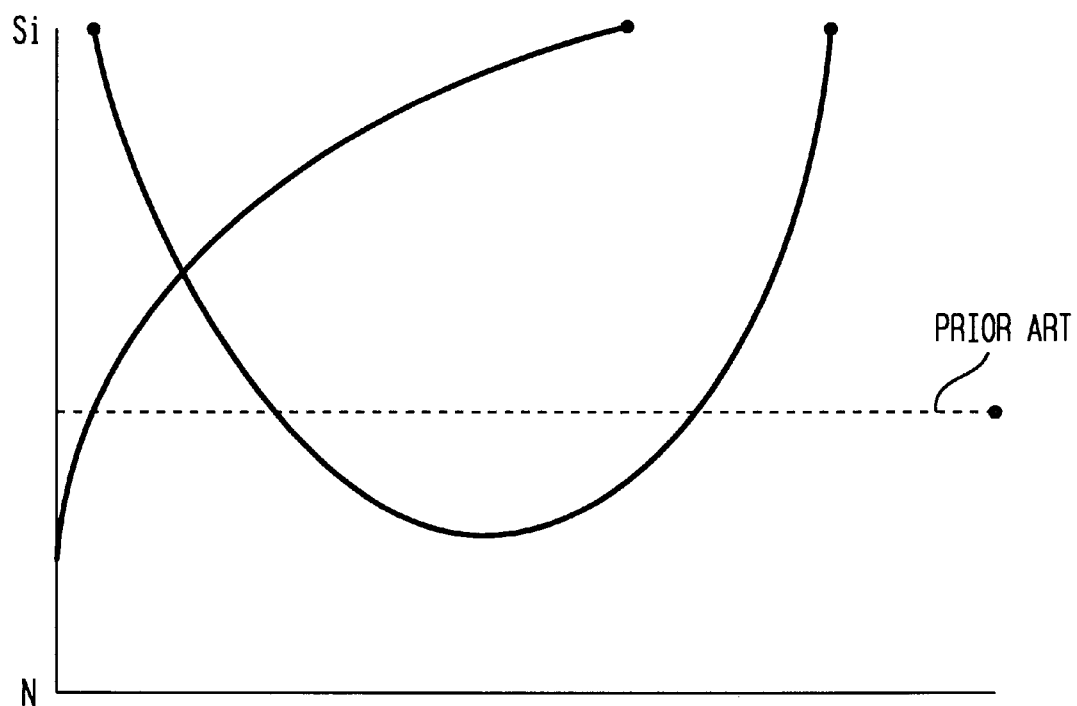

As a further illustration, FIGS. 4A–4C plot the composition of the membrane portion of the inventive mask as a function of membrane thickness for various exemplary embodiments. The hatched line of these figures reflects the prior art, i.e., it reflects a uniform concentration of silicon nitride across the membrane thickness. In FIG. 4A, solid line (1) shows a stepped gradient of silicon nitride and silicon, reflecting layers of materials such as, for example, illustrated in FIG. 3A, wherein two surface layers comprise pure silicon and an intermediate layer comprises silicon nitride. Line (2) (double line with hatching) shows an alternative stepped gradient where only one surface layer comprises pure silicon. In FIG. 4B, solid line (1) shows a linear gradient of silicon nitride and silicon, where at one surface the membrane comprises pure silicon, which is exemplified in FIG. 3B. Line (2) (double line with hatching) of FIG. 4B shows an alternative linear gradient, reflecting a relatively large concentration of nitrogen. Notably, the thickness of the membrane reflected by Line (2) is less than that for Line (1), due to the large nitrogen concentration for Line (2). Generally, the thickness of the membrane should be inversely related to the atomic number of the materials defining the membrane. Other gradients may be employed as well, for example, the parabolic or arcuate gradients illustrated with FIG. 4C.

An important consideration in designing the membrane portion of the mask or in selecting the type of conductivity gradient is that the conductivity of the membrane should be increased as much as possible as compared with prior membranes, without significantly affecting the electron scattering properties of the mask, its transparency, or its strength and rigidity. This is performed by varying the concentration of the conductive materials across the thickness of the membrane, the term "material" as used in this sense encompassing an element or compositions, such as a binary or tertiary composition of Si, C, N, B or O, or one or more dopants. The conductive material mitigates the accumulation of charge within the membrane, which desirably reduces distortion. It is preferable to use a material for fabricating the membrane that has a fine-grained structure or is amorphous to avoid unwanted diffraction effects. Further, the conductive dopants may be formed within or implanted or diffused into the membrane. Contemplated dopants include phosphorus, arsenic, and boron. An important consideration in selecting the dopants and dopant concentrations, as with the other conductive materials, is that the conductivity be increased as much as possible without significantly affecting the electron scattering properties of the mask.

The membrane portion 42' advantageously is on the order of one electron mean free path thick, and the scattering portion 44' three to five means free paths thick. However, the components and thicknesses of the membrane portion may vary depending upon which materials are used. Preferably, low atomic number materials—defined herein as materials having an approximate atomic number of less than 25—are used to fabricate the membrane portion, and high atomic number materials—defined herein as materials having an approximate atomic number of about 40 or more—are used to make the scattering portion. However, a combination of materials may be used, the scattering portion naturally having a higher mean atomic number and greater scattering properties as compared with the membrane portion. Using materials with atomic numbers less than 25, the membrane should be relatively thick, i.e., have a thickness of about 500 to 2,000 Angstroms. For high atomic number materials (i.e., above 40), the layer may be thinner, i.e., have a thickness of about 250–1,000 Angstroms. The desired thickness of the inventive membrane portion may be calculated based on principles known in the field given the atomic number of the materials and the percentage of electrons sought to be transmitted, as described, for example, in Ludwig Reimer, TRANSMISSION ELECTRON MICROSCOPY (2d ed. 1989). Preferably, at least about ten-percent of the electrons incident the membrane surface should be transmitted.

The inventive membrane mask may be readily fabricated making minor modifications to presently-available technology. The layers may be deposited, for example, by altering the flow of gases used during LPCVD processes presently in use, or by use of sputtering with alterations in the sputtering rates. Steps for fabricating the inventive membrane mask in conjunction with a silicon grillage are known and described in the SCALPEL patents and references cited above and incorporated herein. An exemplary process for making one embodiment of the inventive mask is as follows.

One or more silicon wafers are disposed within a chemical vapor deposition reactor and subjected to LPCVD, with the reactive gases comprising a mixture of ammonia ($NH_3$) and dichlorosilane ($SiCl_2H_2$). Run conditions for the LPCVD may comprise an approximate temperature of 860° C. and pressure of 190 mTorr, with depositions below about 900° C. yielding nitride films that are amorphous in nature, which is preferred. In fabricating the inventive membrane portion, the silicon content of the membrane may be controlled by adjusting the $NH_3$ flow rate. Thus, the membrane gradient (linear, stepped, parabolic, etc), may be formed by selectively activating and deactivating the flow of the $NH_3$ gas (or other gases used in the CVD process). For example, a mixture of ($NH_3$) and dichlorosilane ($SiCl_2H_2$) may first be infused into the CVD reactor. The influx of $NH_3$ may be slowly decreased or terminated, thereby increasing the concentration of silicon and decreasing the concentration of SiN being deposited. The relative flow rates and adjustments may be determined by one skilled in the field based on the conductivity gradient desired to be obtained, e.g., for a stepped gradient, the influx of $NH_3$ would be terminated abruptly. After deposition of the membrane portion, the scattering portion and pattern may be formed, e.g., applying sputtering and etching techniques as are known in the field. The mask blank may be bonded to a silicon support ring 50 for patterning (FIG. 2).

Advantageously, the improved mask is employed in a lithography system of the type comprising a radiation source for emitting the charged-particle beam; the scattering-type mask for modulating the beam; one or more projection lenses for focusing the projected beam; an aperture filter for selectively filtering strongly scattered particles; and the wafer having a resist system disposed on its surface. With this system, certain of the charged particles selectively pass through the aperture filter to form a patterned image on the resist layer of the wafer as a result of the different scattering properties of the materials comprising the mask. This system may comprise the SCALPEL system, as schematically illustrated in FIG. 1. Preferred features for other aspects of the SCALPEL system may be obtained from the SCALPEL patents, cited above and incorporated herein by reference. Advantageously, a 4X or 5X projection e-beam lithography system is employed, consistent with general expectation and presently-available technology. Of course, the invention is equally applicable to a 1:1 system as well as to other ratios.

With the inventive mask and use of the SCALPEL system, resolution of 0.18 $\mu$m and below may be achieved. For making a writing device with sub 0.18 $\mu$m features, the mask should have an area of 10,000 mm.$^2$ A step-and-scan printing strategy may be employed using the inventive mask. Also, electron optics may be employed using a relatively short column and large beam convergence angle, both of which help reduce the image blur due to electron-electron interactions.

It is understood that the embodiments described herein are merely exemplary and that a person skilled in the art may make variations and modifications without departing from the spirit and scope of the invention. For example, although the invention is illustrated with reference to the SCALPEL system, it is to be understood that the inventive membrane may be used in other lithography systems as well, e.g., electron-beam lithography, proximity x-ray lithography, and ion beam lithography. All such variations and modifications are intended to be included within the scope of the appended claims.

We claim:

1. A scattering mask adapted for use in a process comprising projection electron-beam lithography, the mask comprising:

a membrane portion having a first mean atomic number, the membrane portion being fabricated with at least one material comprising a conductive material;

a scattering portion having a second mean atomic number, the scattering portion overlying a selected area of the membrane portion, in which the selected area defines a plurality of openings in the scattering portion so that electron beams directed at the mask will scatter differently at regions of the mask comprising both the membrane portion and the scattering portion than at regions of the mask comprising the membrane portion, wherein the membrane portion being fabricated with the at least one conductive material mitigates the accumulation of charge within the membrane portion when electron beams are directed at the mask.

2. A lithography process for use in fabricating integrated circuit devices comprising the step of transmitting an electron beam through a patterned mask onto the device under fabrication, wherein the mask comprises a membrane mask according to claim 1.

3. The mask of claim 1, in which the membrane portion is fabricated with a plurality of materials and at least one of the materials is conductive.

4. The mask of claim 1, in which the membrane portion of the mask has a predetermined thickness and the concentration of conductive material varies across the thickness of the membrane to define a conductivity gradient.

5. The mask of claim 4, in which the conductivity gradient is selected from linear, sloped, stepped, arcuate and parabolic conductivity gradients.

6. The mask of claim 1, in which the at least one conductive material comprises an elemental electrically conductive material.

7. The mask of claim 1, in which the at least one conductive material comprises a a binary or tertiary composition comprising at least two elements selected from the group of silicon, nitrogen, carbon, boron, and oxygen.

8. The mask of claim 1, in which dopants are fabricated into the membrane for comprising the at least one conductive material or for enhancing the conductivity of the membrane.

9. The mask of claim 8, wherein the dopants are selected from the group consisting of boron, phosphorus, and arsenic.

10. The mask of claim 1, in which the scattering portion of the mask comprises tungsten and chromium.

11. The mask of claim 1, in which the membrane portion is fabricated with silicon and silicon nitride, the ratio of silicon to silicon nitride in the membrane defining a conductivity gradient.

12. A scattering mask adapted for use in a process comprising Scattering with Angular Limitation in Projection Electron-beam Lithography (SCALPEL), the mask comprising:

a membrane portion having a certain thickness and a first mean atomic number, the membrane portion being fabricated with at least one conductive material, the concentration of the at least one conductive material being varied across the thickness of the membrane to define a conductivity gradient;

a scattering portion having a second mean atomic number, the scattering portion overlying a selected area of the membrane portion, in which the selected area defines a plurality of openings in the scattering portion so that electron beams directed at the mask will scatter differently at regions of the mask comprising both the membrane portion and the scattering portion than at regions of the mask comprising the membrane portion, wherein the membrane portion being fabricated with the at least one conductive material defining the conductivity gradient mitigates the accumulation of charge within the membrane portion when electron beams are directed at the mask.

13. The mask of claim 12 adapted to form a patterned image on a resist layer having a resolution of about 0.18 $\mu$m or less.

14. A charged-particle beam lithography apparatus for imposing a patterned image onto a semiconductor device under fabrication for selectively processing the device, the apparatus comprising (a) a mask comprising:

a membrane portion having a first mean atomic number, the membrane portion being fabricated with at least one material comprising a conductive material;

a scattering portion having a second mean atomic number, the scattering portion overlying a selected area of the membrane portion, in which the selected area defines a plurality of openings in the scattering portion, wherein the membrane portion being fabricated with the at least one conductive material mitigates the accumulation of charge within the membrane portion when electron beams are directed at the mask;

(b) a radiation source for emitting a beam of charged particles onto the mask to dissipate through the mask, whereby the beam of charged particles directed at the mask scatter differently at regions of the mask comprising both the membrane portion and the scattering portion than at regions of the mask comprising the membrane portion; and (c) an aperture filter for blocking certain of the scattered charged particles and allowing certain of the charged particles to pass to and impinge upon the device under fabrication, thereby forming a patterned image on the device.

* * * * *